United States Patent
Saigo et al.

[11] Patent Number: 6,091,246
[45] Date of Patent: Jul. 18, 2000

[54] BATTERY REMAINING CAPACITY MEASURING APPARATUS

[75] Inventors: Tsutomu Saigo; Yoichi Arai, both of Shizuoka-ken, Japan

[73] Assignee: Yazaki Corporation, Tokyo, Japan

[21] Appl. No.: 09/206,938

[22] Filed: Dec. 8, 1998

[30] Foreign Application Priority Data

Dec. 9, 1997 [JP] Japan ................................. 9-339142

[51] Int. Cl.$^7$ ................................................. G01R 31/30
[52] U.S. Cl. ........................................... 324/434; 324/425
[58] Field of Search ................................... 324/426, 427, 324/428, 434; 320/116, 119, 132, 134, 136

[56] References Cited

U.S. PATENT DOCUMENTS

| | | | |
|---|---|---|---|
| 5,479,085 | 12/1995 | Honda et al. | 320/48 |
| 5,545,969 | 8/1996 | Hasegawa | 320/5 |
| 5,578,927 | 11/1996 | Perelle | 324/434 |
| 5,602,481 | 2/1997 | Fukuyama | 324/434 |
| 5,612,608 | 3/1997 | Ishiguro et al. | 320/48 |
| 5,703,469 | 12/1997 | Kinoshita | 320/48 |

FOREIGN PATENT DOCUMENTS

8-62310  3/1996  Japan .

*Primary Examiner*—Vincent Q. Nguyen
*Attorney, Agent, or Firm*—Finnegan, Henderson, Farabow, Garrett & Dunner, L.L.P.

[57] ABSTRACT

Each voltage sensor is provided one to one for a plurality of batteries, for detecting a terminal voltage of each battery. A current sensor detects a current flowing from the plurality of batteries to a load. A reading section reads for each battery a voltage value detected by a corresponding voltage sensor and a current value detected by the current sensor at every predetermined period of time, and collects a predetermined number of detected voltage values and corresponding detected current values. A remaining capacity calculator calculates a battery remaining capacity for each battery based on the plurality of detected voltage values and the plurality of corresponding detected current values, selects a battery remaining capacity having a minimum value from out of a plurality of calculated battery remaining capacities, and calculates a remaining capacity of the whole of the plurality of batteries based on the selected battery remaining capacity.

9 Claims, 5 Drawing Sheets

FIG.5

BATTERY REMAINING CAPACITY MEASURING APPARATUS

BACKGROUND OF THE INVENTION

1. Field of the Invention

The present invention relates to a battery remaining capacity measuring apparatus for measuring a remaining capacity of batteries used for an electric automobile or the like.

2. Description of Related Art

In general, an electric automobile is operated by a battery such as a lead storage battery or a nickel oxygen storage battery or the like, and therefore, accurateness is required for estimating a remaining capacity of such a battery. There are following methods for measuring the remaining capacity of a battery of this type.

(1) A current integrating system for measuring and integrating a current volume actually supplied from a battery to a load side and then estimating a current remaining capacity of the battery from a current integrated value obtained by this integration and a current volume at the time of a charging.

(2) A voltage detecting system for estimating the remaining capacity of a battery by measuring a terminal voltage at the time when a discharge current flowed from a terminal of the battery to a load side.

According to a battery remaining capacity measuring apparatus described in Japanese Patent Application Laid-open Publication No. 8-62310 which employs the voltage detecting system of (2), for example, a terminal voltage of a battery and a current flowing to a load are read by sampling at every 1 ms, for example. Then, the data read during a lapse of 100 ms period, for example, are collected and averaged for the voltage and current respectively. An averaged voltage value and an averaged current value are collected by 100 for each. Thus, based on the collected 100 data for average voltage values and average current values, an approximate straight line is obtained based on the method of least squares.

Next, based on the approximate straight line obtained, a voltage value corresponding to a predetermined discharge current is calculated, a remaining capacity of the battery corresponding to this voltage value is calculated, and the calculated remaining capacity of the battery is displayed.

In the case where an electric automobile is operated by a battery unit structured by a plurality of batteries connected in series, a total voltage and a total current of the whole batteries are measured respectively, and a remaining capacity of the batteries as a whole is calculated based on these measured total voltage and total current.

However, there is a case where the remaining capacity of a specific battery is lowered due to deterioration of this battery or other reason among the plurality of batteries. In such a case, as the calculated remaining capacity of the whole batteries shows an average remaining capacity of each battery, this average value shows a larger value than the noted minimum remaining capacity value of this specific battery. In other words, as it is not possible to obtain an accurate remaining capacity of the batteries, there has been a risk of an occurrence of an excess discharging of a battery due to a reduction of the remaining capacity of a specific battery.

SUMMARY OF THE INVENTION

It is an object of the present invention to provide a battery remaining capacity measuring apparatus capable of more accurately calculating a remaining capacity of batteries and capable of avoiding an excess discharging or the like attributable to an extreme reduction in the remaining capacity of a specific battery.

In order to achieve the above object, there is provided a battery remaining capacity measuring apparatus, comprising: a plurality of voltage detectors disposed corresponding to a plurality of batteries connected in series, for detecting terminal voltages of the plurality of batteries respectively; a current detector for detecting a current flowing from the plurality of batteries to a load; a voltage and current collector for reading, for each battery, both a voltage value detected by the corresponding voltage detector and a current value detected by the current detector at every predetermined period of time, and collecting a predetermined number of detected voltage values and corresponding detected current values; and a remaining capacity calculator for calculating a battery remaining capacity for each battery based on the predetermined number of detected voltage values and the corresponding detected current values collected by the voltage and current collector, selecting a battery remaining capacity having a minimum value from out of a plurality of calculated battery remaining capacities, and calculating a battery remaining capacity of the whole of the plurality of batteries based on the selected battery remaining capacity.

According to the present invention, it becomes possible to calculate a remaining capacity more accurately and to avoid an excess discharging or the like of batteries due to a reduction of the remaining capacity of a specific battery.

According to one aspect of a preferred embodiment of the present invention, the battery remaining capacity measuring apparatus further comprises, a voltage-current approximate straight line calculator for calculating for each battery a voltage-current approximate straight line function that shows a relationship between voltage and current by applying a method of least squares to the predetermined number of detected voltage values and the corresponding detected current values collected by the voltage-current collector, wherein the remaining capacity calculator calculates a plurality of battery remaining capacities corresponding to the plurality of batteries based on a plurality of voltage-current approximate straight line functions corresponding to the plurality of batteries calculated by the voltage-current approximate straight line calculator, selects the battery remaining capacity having the minimum value from out of the plurality of calculated battery remaining capacities, and calculates a battery remaining capacity of the whole of the plurality of batteries based on the selected battery remaining capacity.

According to another aspect of the preferred embodiment of the present invention, each time when each of the detected voltage values and the corresponding detected current values reach a constant number, the voltage and current collector averages each of the detected voltage values and the corresponding detected current values to obtain an averaged voltage value and corresponding averaged current value, and collects averaged voltage values and corresponding averaged current values by a predetermined number.

According to another aspect of the preferred embodiment of the present invention, the battery remaining capacity measuring apparatus further comprises an estimate voltage calculator for calculating for each of the plurality of batteries a voltage value, when a current value is a negative value or a zero value, as an estimate voltage, in the approximate straight line function calculated by the voltage-current approximate straight line calculator, wherein the remaining capacity calculator calculates for each of the plurality of batteries each of the plurality of battery remaining capacities based on the estimate voltage calculated by the estimate voltage calculator.

According to still another aspect of the preferred embodiment of the present invention, the battery remaining capacity measuring apparatus further comprises a display for displaying the battery remaining capacity of the whole of the plurality of batteries calculated by the remaining capacity calculator.

Further, in order to achieve the above object, there is provided a battery remaining capacity measuring apparatus, comprising: a plurality of voltage detectors disposed corresponding to a plurality of batteries connected in series, for detecting terminal voltages of the plurality of batteries respectively; a current detector for detecting a current flowing from the plurality of batteries to a load; a voltage and current collector for reading, for each battery, both a voltage value detected by the corresponding voltage detector and a current value detected by the current detector at every predetermined period of time, and collecting a predetermined number of detected voltage values and corresponding detected current values; and a remaining capacity calculator for calculating a battery estimate voltage for each battery based on the predetermined number of detected voltage values and the corresponding detected current values collected by the voltage and current collector, selecting an estimate voltage having a minimum value from out of a plurality of calculated battery estimate voltages, and calculating a battery remaining capacity of the whole of the plurality of batteries based on the selected estimate voltage.

According to one aspect of a preferred embodiment of the present invention, the battery remaining capacity measuring apparatus further comprises a voltage-current approximate straight line calculator for calculating for each battery a voltage-current approximate straight line function that shows a relationship between voltage and current by applying a method of least squares to the predetermined number of detected voltage values and the corresponding detected current values collected by the voltage-current collector, wherein the remaining capacity calculator calculates a plurality of estimate voltages corresponding to the plurality of batteries based on a plurality of voltage-current approximate straight line functions corresponding to the plurality of batteries calculated by the voltage-current approximate straight line calculator, selects the estimate voltage having the minimum value from out of the plurality of estimate voltage, and calculates a battery remaining capacity of the whole of the plurality of batteries based on the selected estimate voltage.

According to another aspect of the preferred embodiment of the present invention, each time when each of the detected voltage values and the corresponding detected current values reach a constant number, the voltage and current collector averages each of the detected voltage values and the corresponding detected current values to obtain an averaged voltage value and corresponding averaged current value, and collects averaged voltage values and corresponding averaged current values by a predetermined number.

According to still another aspect of the preferred embodiment of the present invention, the battery remaining capacity measuring apparatus further comprises a display for displaying the battery remaining capacity of the whole of the plurality of batteries calculated by the remaining capacity calculator.

The nature, principle and utility of the invention will become more apparent from the following detailed description when read in conjunction with the accompanying drawings.

DESCRIPTION OF THE PREFERRED EMBODIMENTS

Embodiments of a battery remaining capacity measuring apparatus according to the present invention will be explained in detail below with reference to the accompanying drawings.

First Embodiment

Figure 1:
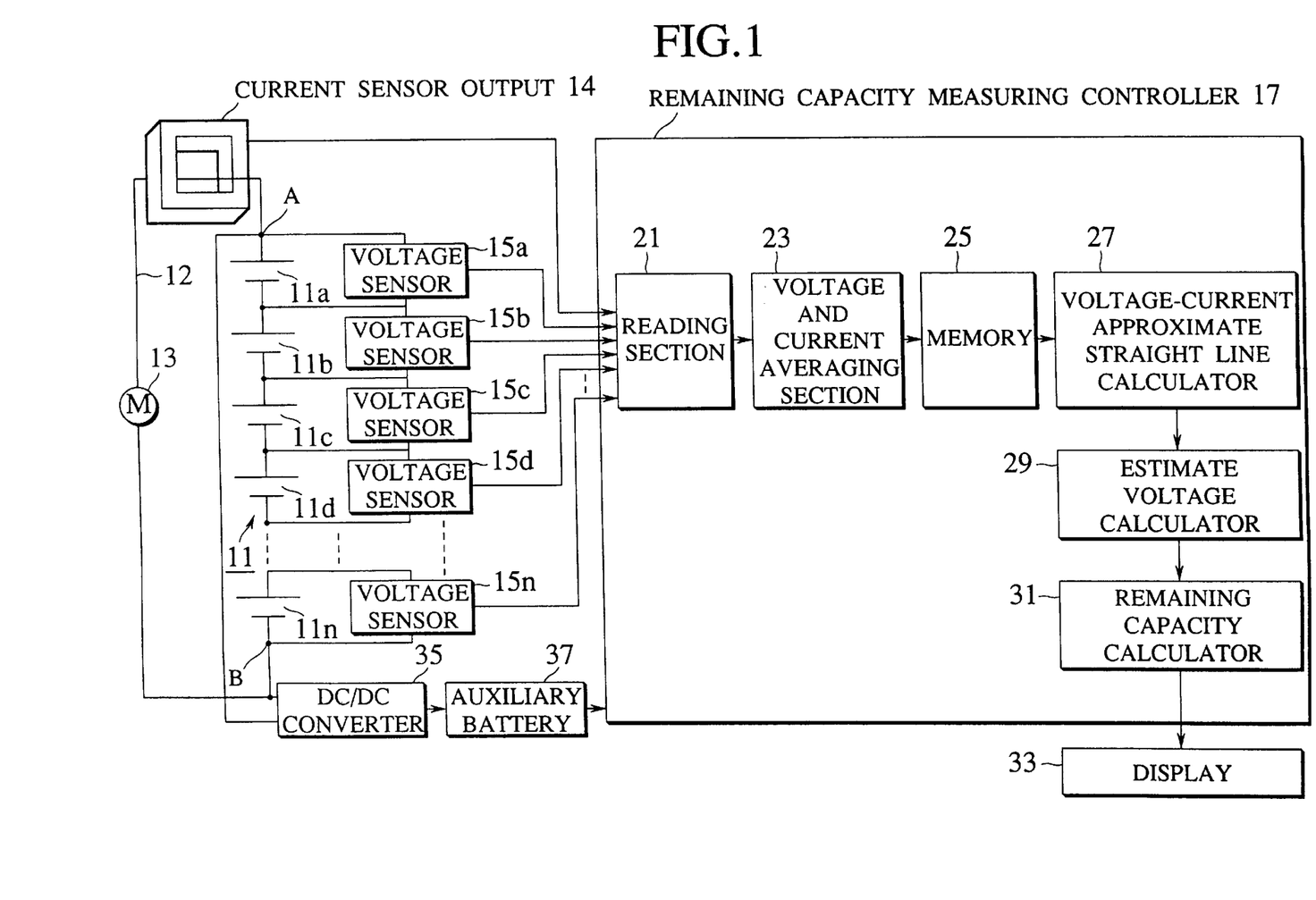
FIG. 1 is a block diagram for showing a configuration of a battery remaining capacity measuring apparatus according to a first embodiment of the present invention.

FIG. 1 is a block diagram for showing a configuration of a battery remaining capacity measuring apparatus according to a first embodiment of the present invention. The battery remaining capacity measuring apparatus shown in FIG. 1 is mounted on an electric automobile, for measuring a remaining capacity of batteries.

In FIG. 1, a plurality of batteries 11a to 11n are connected in series, and one end of the battery 11a and one end of the battery 11n are connected to a drive motor 13 as a load through a power supply line 12. The drive motor 13 makes an electric automobile not shown run by being driven by a terminal voltage and a current of the whole of the plurality of batteries 11a to 11n.

Each of the batteries 11a to 11n is, for example, a lead storage battery or a nickel oxygen storage battery, which is charged by a charger not shown. Each of the batteries 11a to 11n has a voltage of about 12 V, for example, and a total voltage of the whole batteries is about 288 V, for example.

A current sensor 14 detects a current flowing from each of the batteries 11a to 11n to the drive motor 13, and outputs a detected current value to a remaining capacity measuring controller 17. Voltage sensors 15a to 15n are provided corresponding to the series connected batteries 11a to 11n respectively, and the voltage sensors 15a to 15n detect terminal voltages of the corresponding batteries and output the detected voltages to the remaining capacity measuring controller 17.

The remaining capacity measuring controller 17 is provided in an electronic control unit (ECU) not shown, and measures a remaining capacity of each of the batteries 11a to 11n based on a voltage value of each of the batteries 11a to 11n from the corresponding voltage sensors 15a to 15n and a current value from the current sensor 14.

The remaining capacity measuring controller 17 is structured by a reading section 21, a voltage and current averaging section 23, a memory 25, a voltage-current approximate straight line calculator 27, an estimate voltage calculator 29 and a remaining capacity calculator 31. The remaining capacity estimate controller 17 functions based on the execution of control programs stored in a read-only memory (ROM) not shown, by a central processing unit (CPU).

The reading section 21 inputs detected currents from the current sensor 14, inputs detected voltages of the batteries from the corresponding voltage sensors 15a to 15n, and samples for each battery a detected current and a detected voltage at every predetermined period of time. The voltage and current averaging section 23 calculates an average value of each of the sampled detected currents and the sampled detected voltages for each battery at every predetermined period of time, and outputs a calculated average value of voltage and current respectively to the memory 25 at every predetermined period of time.

The voltage-current approximate straight line calculator 27 reads a plurality of average voltage values and a corresponding plurality of average current values for each battery from the memory 25, and calculates a voltage-current approximate straight line function (V=a·I+b), where a and b are coefficients, by applying the method of least squares to the read-out average voltage values and average current values.

The estimate voltage calculator 29 substitutes, for each battery, a negative current value for a current I in the voltage-current approximate straight line function (V=aI+b) obtained by the calculation of the voltage-current approximate straight line calculator 27, and calculates a voltage value at that time as an estimate voltage value.

The remaining capacity calculator 31 calculates, for each battery, a remaining capacity value corresponding to the estimate voltage value of the battery calculated by the estimate voltage calculator 29, selects a remaining capacity value of a minimum value from out of the remaining capacity values of the batteries calculated, and employs the selected remaining capacity value as a remaining capacity of the batteries as a whole. The display 33 displays a value of the remaining capacity calculated by the remaining capacity calculator 31.

A DC/DC converter 35 converts a total voltage of the batteries 11a to 11n (approximately 288 V) into a 12 V power supply of a weak electric current system, and supplies this 12 V power to an auxiliary battery 37. The auxiliary battery 37 supplies the 12 V power to the remaining capacity measuring controller 17 to operate the remaining capacity measuring controller 17.

Figure 2:
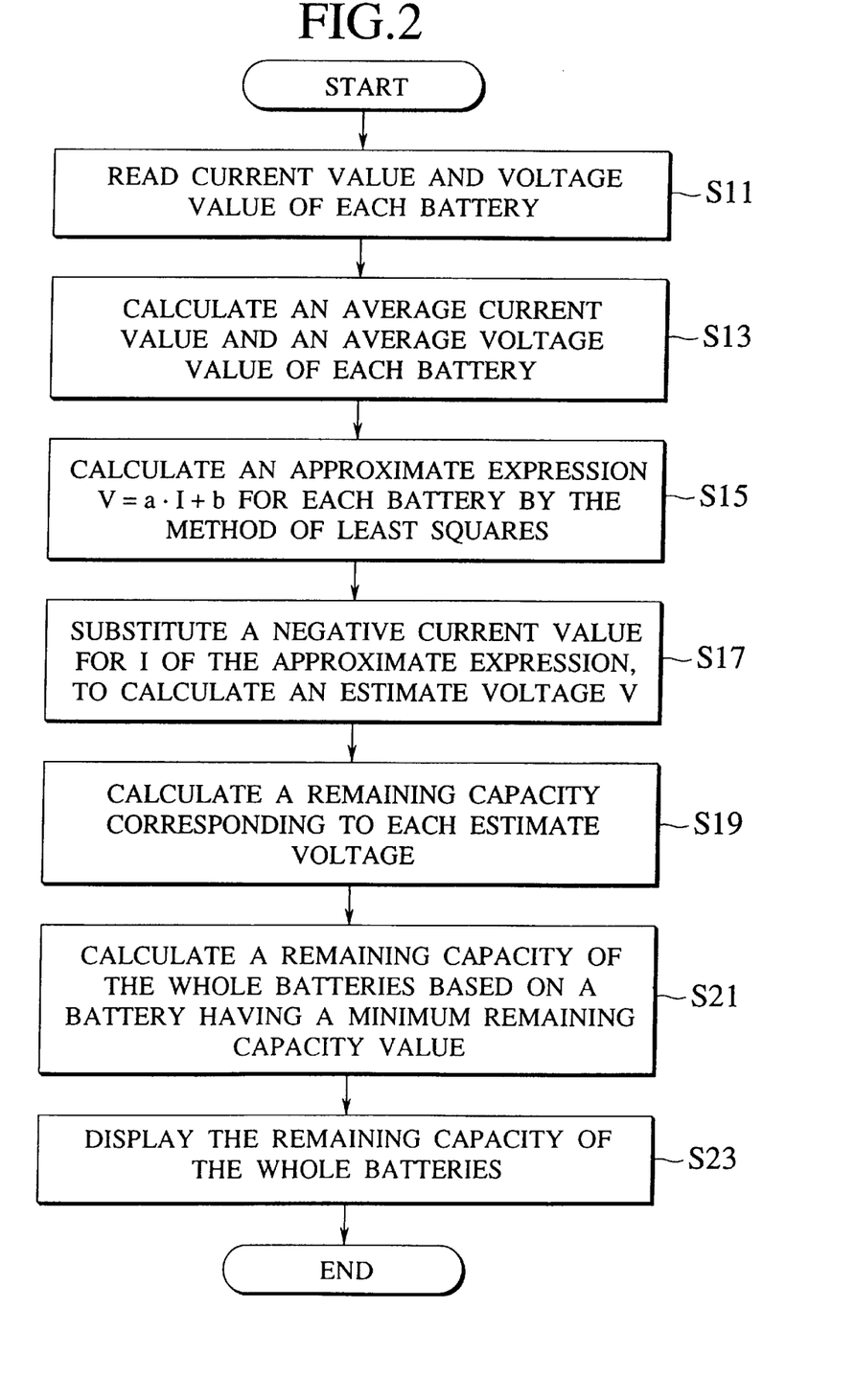
FIG. 2 is a flowchart for showing an operation of the battery remaining capacity measuring apparatus according to the first embodiment.

Next, the operation of the battery remaining capacity measuring apparatus having the above-described structure will be explained with reference to a flowchart shown in FIG. 2. At first, the power of the auxiliary battery 37 is supplied to the remaining capacity measuring controller 17 so that the remaining capacity controller 17 operates.

The current sensor 14 detects a current flowing from each of the batteries 11a to 11n to the drive motor 13, and the voltage sensors 15a to 15n detect terminal voltages of the corresponding batteries. For example, the voltage sensor 15a detects a terminal voltage of the battery 11a and the voltage sensor 15n detects a terminal voltage of the battery 11n.

Next, the remaining capacity measuring controller 17 decides whether the electric automobile is in a stopped state or not. If the electric automobile is not in a stopped state, that is, if the electric automobile is in operation, the reading section 21 inputs detected currents (discharge currents) from the current sensor 14, and at the same time, inputs detected voltages of the batteries from the corresponding voltage sensors 15a to 15n, and samples a detected current and a detected voltage for each battery at every predetermined period of time, for example, at every 1 ms (step S11).

Further, at every predetermined period of time, for example, at every 10 seconds, the voltage and current averaging section 23 calculates an average value of the sampled detected currents and detected voltages respectively for each battery, and stores the calculated average values in the memory 25 (step S13). In this case, a plurality of average values of voltage and current are stored in different address areas for each battery.

Figure 3:
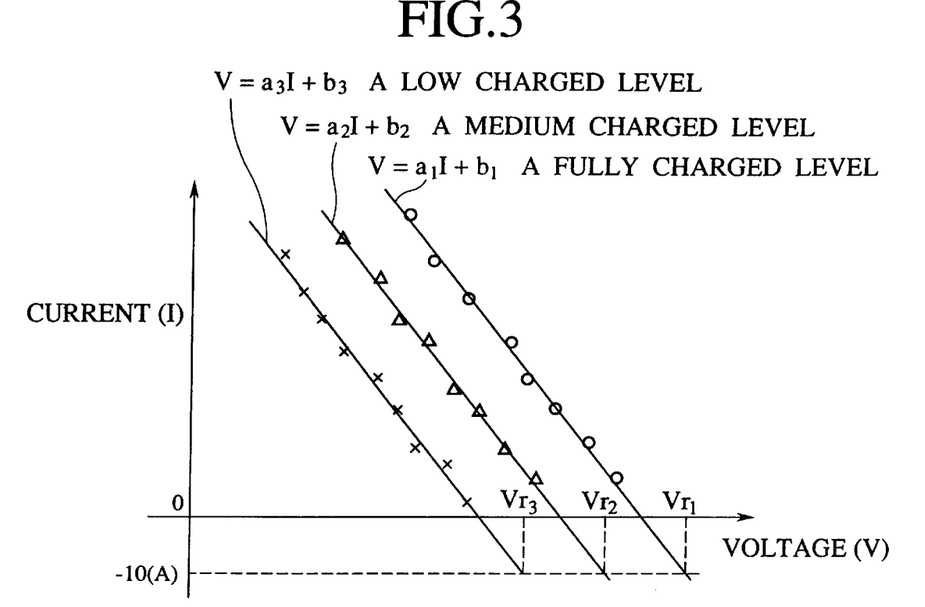
FIG. 3 is a voltage-current characteristic diagram for each battery.

When the battery 11a is at a fully charged level, for example, voltage to current values are plotted by a ○ mark in the voltage-current characteristic diagram in FIG. 3. When the battery 11b is at a medium charged level, for example, voltage to current values are plotted by a Δ mark. When the battery 11c is at a low charged level, for example, voltage to current values are plotted by an X mark.

Next, the voltage-current approximate straight line calculator 27 reads, for each battery, a plurality of average voltage values and a corresponding plurality of average current values from the memory 25, and calculates a voltage-current approximate straight line function (V=a·I+b), where a and b are coefficients, by applying the method of least squares to the read-out average voltage values and average current values (step S15).

When the battery 11a is at a fully charged level, for example, a voltage-current approximate straight line function ($V=a_1·I+b_1$) is calculated based on the voltage to current values plotted by the ○ mark. When the battery 11b is at a medium charged level, for example, a voltage-current approximate straight line function ($V=a_2·I+b_2$) is calculated based on the voltage to current values plotted by the Δ mark. When the battery 11c is at a low charged level, for example, a voltage-current approximate straight line function ($V=a_3·I+b_3$) is calculated based on the voltage to current values plotted by the X mark. Thus, the process of calculating a voltage-current approximate straight line function is carried out for each of the batteries 11a to 11n.

The estimate voltage calculator 29 calculates, for each battery, a cross point on a voltage axis, when the current I is a negative current value or a zero current value, as an estimate current value in the voltage-current approximate straight line function (V=a·I+b) obtained by the calculation of the voltage-current approximate straight line calculator 27 (step S17).

Figure 4:
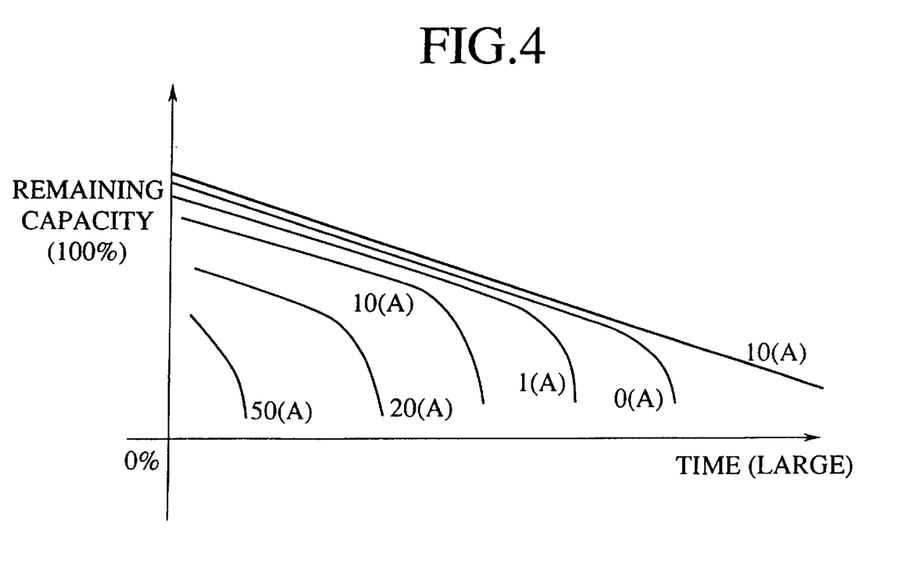
FIG. 4 is a diagram for showing time characteristics of a remaining capacity at each current level.

The reason why the current I is assumed as a negative current value or a zero current value can be explained by the time characteristic diagram of remaining capacities corresponding to the estimate voltage values shown in FIG. 4. When a discharge current is large, a discharge time is short, and when a discharge current is zero or a negative value, for example, a discharge time is relatively longer, with the remaining capacity characteristic diagram closer to a straight line. Accordingly, if the current is a negative or zero value, an accurate remaining capacity can be obtained.

By substituting a current value (−10 A) for the voltage-current approximate straight line function ($V=a_1·I+b_1$) in FIG. 3, for example, an estimate voltage value $Vr_1$ is obtained. By substituting a current value (−10 A) for the voltage-current approximate straight line function ($V=a_2·I+b_2$), an estimate voltage value $Vr_2$ is obtained. By substituting a current value (−10 A) for the voltage-current approximate straight line function ($V=a_3·I+b_3$), an estimate voltage value $Vr_3$ is obtained. Thus, the process of calculating an estimate voltage value is carried out for each of the batteries 11a to 11n. The calculated estimate voltages may be stored for each battery in a memory not shown.

Next, the remaining capacity calculator 31 calculates, for each battery, a remaining capacity value corresponding to an estimate voltage value of a battery calculated by the estimate voltage calculator 29 (step S19). Then, the remaining capacity calculator 31 selects a remaining capacity value of a minimum value from out of a plurality of remaining capacity values calculated, and employs the selected remaining capacity value as a remaining capacity of the batteries as a whole (step S21). The remaining capacity calculator 31 also specifies a battery having the selected remaining capacity value. The specification of the battery is carried out by either an address number or a battery identification number for identifying each battery.

Further, the remaining capacity value is expressed in percentage (1% to 100%). Then, the remaining capacity value obtained by the remaining capacity calculator 31 is displayed in the display 33 (step S23).

If the remaining capacity value of the minimum value among the remaining capacity values of the plurality of batteries is displayed together with a battery identification number, it becomes possible to specify which one of the batteries has a lowered remaining capacity.

As explained above, according to the battery remaining capacity measuring apparatus of the first embodiment, there are provided one current sensor 14 and a plurality of voltage sensors corresponding to a plurality of batteries, and the current sensor detects discharge currents of the batteries and the voltage sensors detect terminal voltages of the batteries, so that a remaining capacity of each battery is calculated based on detected voltage values and current values. Thus, it is possible to decide a reduction in the remaining capacity of a specific battery.

Further, the remaining capacity of the whole batteries is calculated based on the remaining capacity of the minimum value among the individual remaining capacities of the batteries. In this case, if the remaining capacity of the battery 11c is 10% as a minimum value among the values of a plurality of batteries, for example, this remaining capacity of 10% is employed as the remaining capacity of the whole batteries.

With the above arrangement, it becomes possible to obtain more accurately the remaining capacity of the whole batteries than according to the conventional method of obtaining the remaining capacity of the whole batteries by averaging the remaining capacities of the whole batteries. Further, if the remaining capacity of a minimum value is displayed as the remaining capacity of the whole batteries, it becomes possible to avoid an excess discharging due to a specific battery that has an extremely low remaining capacity, thus enabling a more reliable management of the batteries.

Moreover, as the remaining capacity of the whole of the plurality of batteries is displayed, a driver can decide the remaining capacity of the batteries by watching the displayed remaining capacity.

Second Embodiment

Figure 5:
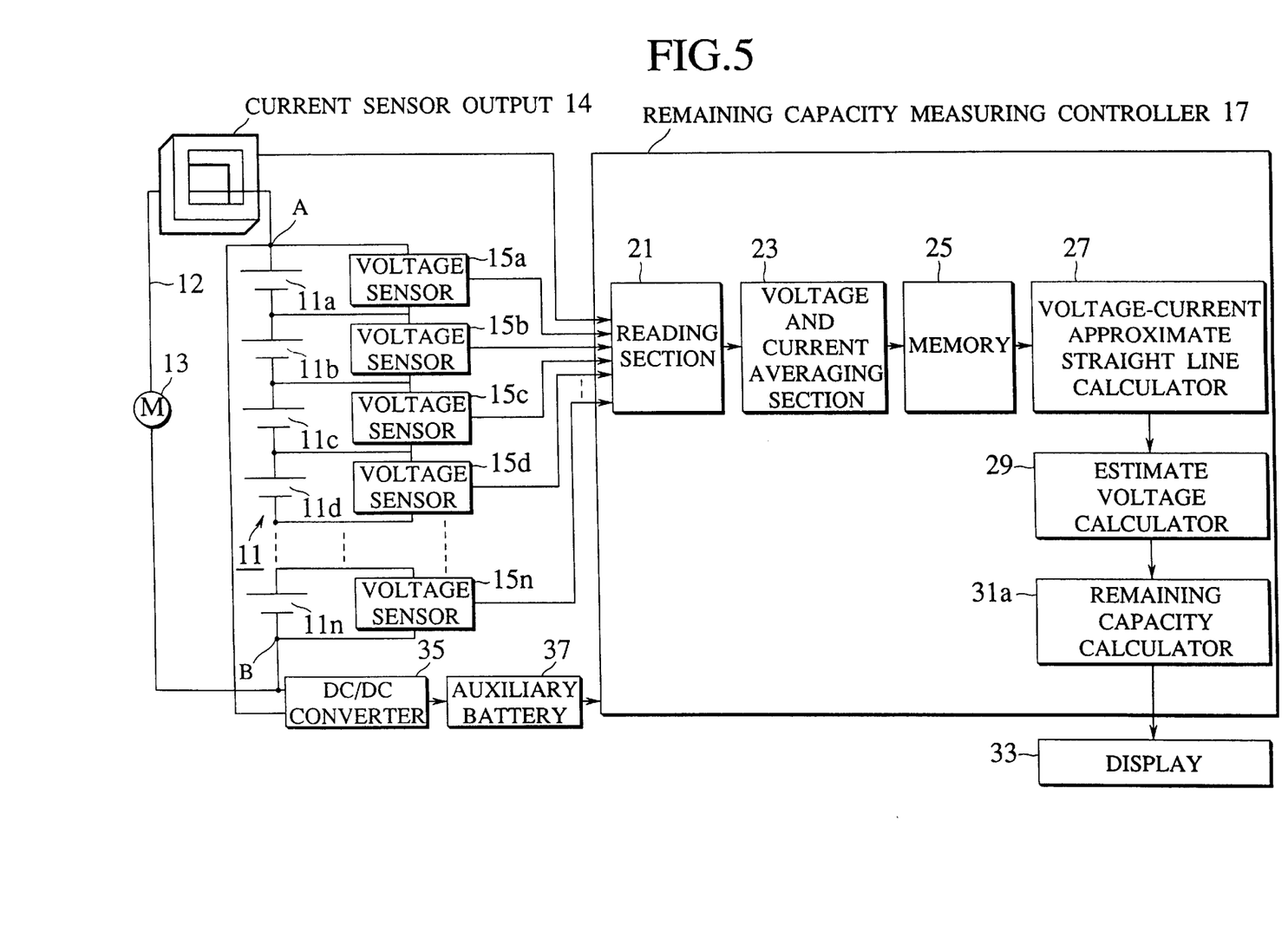
FIG. 5 is a block diagram for showing a configuration of a battery remaining capacity measuring apparatus according to a second embodiment of the present invention.

A battery remaining capacity measuring apparatus according to a second embodiment of the present invention will be explained next. FIG. 5 is a block diagram for showing a configuration of a battery remaining capacity measuring apparatus according to a second embodiment of the present invention. The battery remaining capacity measuring apparatus according to the second embodiment shown in FIG. 5 is different from that of the first embodiment in the structure of a remaining capacity calculator 31a.

The remaining capacity calculator 31a selects an estimate voltage value having a minimum value from out of the estimate voltage values of batteries 11a to 11n calculated by an estimate voltage calculator 29, and calculates a remaining capacity of the whole batteries based on the selected estimate voltage value.

The structures of the rest portions are identical with those of the first embodiment shown in FIG. 1, and identical portions are referenced with like reference characters, of which detailed explanation will be omitted.

Figure 6:
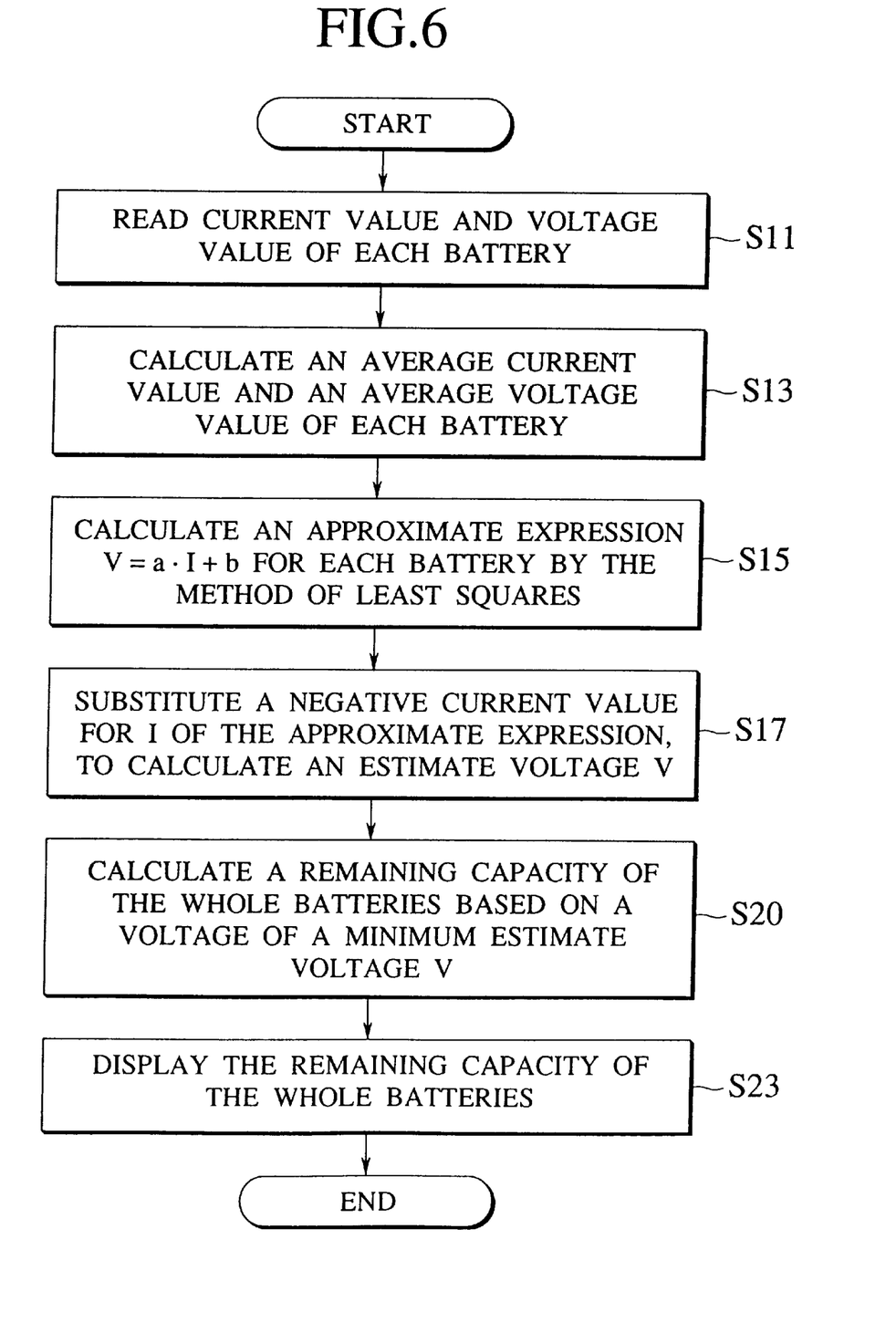
FIG. 6 is a flowchart for showing an operation of the battery remaining capacity measuring apparatus according to the second embodiment.

The operation of the battery remaining capacity measuring apparatus according to the second embodiment will be explained next with reference to a flowchart shown in FIG. 6. The processes in the step S11 to the step S17 in FIG. 6 are the same as those in the first embodiment, and their explanation will be omitted.

The remaining capacity calculator 31a selects an estimate voltage value having a minimum value from out of the estimate voltage values of the batteries 11a to 11n calculated by the estimate voltage calculator 29, and calculates a remaining capacity corresponding to the selected estimate voltage value as the remaining capacity value of the whole batteries (step S20). Then, the remaining capacity value calculated by the remaining capacity calculator 31 is displayed in the display 33 (step S23).

Namely, an effect similar to that obtained in the first embodiment can also be obtained in the second embodiment. In this case, it can be evaluated such that a battery having an estimate voltage of a minimum value has the minimum remaining capacity.

Further, while in the first embodiment, a remaining capacity value corresponding to each estimate voltage value is calculated and then a remaining capacity value of a minimum value is selected from out of a plurality of remaining capacity values, in the second embodiment, an estimate voltage value of a minimum value is selected from a plurality of estimate voltage values and then a remaining capacity value corresponding to the selected estimate voltage value is calculated. Therefore, the second embodiment has an effect that the calculation time is shorter than that of the first embodiment.

As explained above, according to the present invention, it is possible to calculate more accurately a remaining capacity of batteries and to avoid an excess discharging or the like due to a reduction in the remaining capacity of a specific battery.

It should be understood that many modifications and adaptations of the invention will become apparent to those skilled in the art and it is intended to encompass such obvious modifications and changes in the scope of the claims appended hereto.

What is claimed is:

1. A battery remaining capacity measuring apparatus, comprising:

a plurality of voltage detectors disposed corresponding to a plurality of batteries connected in series, for detecting terminal voltages of the plurality of batteries respectively;

a current detector for detecting a current flowing from the plurality of batteries to a load;

a voltage and current collector for reading, for each battery, both a voltage value detected by the corresponding voltage detector and a current value detected by the current detector at every predetermined period of time, and collecting a predetermined number of detected voltage values and corresponding detected current values; and a remaining capacity calculator for calculating a battery remaining capacity for each battery based on the predetermined number of detected voltage values and the corresponding detected current values collected by the voltage and current collector, selecting a battery remaining capacity having a minimum value from out of a plurality of calculated battery remaining capacities, and calculating a battery remaining capacity of the whole of the plurality of batteries based on the selected battery remaining capacity.

2. A battery remaining capacity measuring apparatus according to claim 1, further comprising:

a voltage-current approximate straight line calculator for calculating for each battery a voltage-current approximate straight line function that shows a relationship between voltage and current by applying a method of least squares to the predetermined number of detected voltage values and the corresponding detected current values collected by the voltage-current collector, wherein the remaining capacity calculator calculates a plurality of battery remaining capacities corresponding to the plurality of batteries based on a plurality of voltage-current approximate straight line functions corresponding to the plurality of batteries calculated by the voltage-current approximate straight line calculator, selects the battery remaining capacity having the minimum value from out of the plurality of calculated battery remaining capacities, and calculates a battery remaining capacity of the whole of the plurality of batteries based on the selected battery remaining capacity.

3. A battery remaining capacity measuring apparatus according to claim 2, further comprising:

an estimate voltage calculator for calculating for each of the plurality of batteries a voltage value, when a current value is a negative value or a zero value, as an estimate voltage, in the approximate straight line function calculated by the voltage-current approximate straight line calculator, wherein the remaining capacity calculator calculates for each of the plurality of batteries each of the plurality of battery remaining capacities based on the estimate voltage calculated by the estimate voltage calculator.

4. A battery remaining capacity measuring apparatus according to claim 1, wherein each time when each of the detected voltage values and the corresponding detected current values reach a constant number, the voltage and current collector averages each of the detected voltage values and the corresponding detected current values to obtain an averaged voltage value and corresponding averaged current value, and collects averaged voltage values and corresponding averaged current values by a predetermined number.

5. A battery remaining capacity measuring apparatus according to claim 1, further comprising:

a display for displaying the battery remaining capacity of the whole of the plurality of batteries calculated by the remaining capacity calculator.

6. A battery remaining capacity measuring apparatus, comprising:

a plurality of voltage detectors disposed corresponding to a plurality of batteries connected in series, for detecting terminal voltages of the plurality of batteries respectively;

a current detector for detecting a current flowing from the plurality of batteries to a load;

a voltage and current collector for reading, for each battery, both a voltage value detected by the corresponding voltage detector and a current value detected by the current detector at every predetermined period of time, and collecting a predetermined number of detected voltage values and corresponding detected current values; and a remaining capacity calculator for calculating a battery estimate voltage for each battery based on the predetermined number of detected voltage values and the corresponding detected current values collected by the voltage and current collector, selecting an estimate voltage having a minimum value from out of a plurality of calculated battery estimate voltages, and calculating a battery remaining capacity of the whole of the plurality of batteries based on the selected estimate voltage.

7. A battery remaining capacity measuring apparatus according to claim 6, further comprising:

a voltage-current approximate straight line calculator for calculating for each battery a voltage-current approximate straight line function that shows a relationship between voltage and current by applying a method of least squares to the predetermined number of detected voltage values and the corresponding detected current values collected by the voltage-current collector, wherein the remaining capacity calculator calculates a plurality of estimate voltages corresponding to the plurality of batteries based on a plurality of voltage-current approximate straight line functions corresponding to the plurality of batteries calculated by the voltage-current approximate straight line calculator, selects the estimate voltage having the minimum value from out of the plurality of estimate voltage, and calculates a battery remaining capacity of the whole of the plurality of batteries based on the selected estimate voltage.

8. A battery remaining capacity measuring apparatus according to claim 6, wherein each time when each of the detected voltage values and the corresponding detected current values reach a constant number, the voltage and current collector averages each of the detected voltage values and the corresponding detected current values to obtain an averaged voltage value and corresponding averaged current value, and collects averaged voltage values and corresponding averaged current values by a predetermined number.

9. A battery remaining capacity measuring apparatus according to claim 6, further comprising:

a display for displaying the battery remaining capacity of the whole of the plurality of batteries calculated by the remaining capacity calculator.

* * * * *